United States Patent
Kusuhara

(10) Patent No.: US 9,831,069 B2
(45) Date of Patent: Nov. 28, 2017

(54) CVD APPARATUS AND METHOD FOR FORMING CVD FILM

(75) Inventor: Masaki Kusuhara, Tokyo (JP)

(73) Assignee: WACOM, Tokyo (JP)

( * ) Notice: Subject to any disclaimer, the term of this patent is extended or adjusted under 35 U.S.C. 154(b) by 669 days.

(21) Appl. No.: 14/122,028

(22) PCT Filed: May 31, 2012

(86) PCT No.: PCT/JP2012/064176
§ 371 (c)(1),
(2), (4) Date: Dec. 30, 2013

(87) PCT Pub. No.: WO2012/165583
PCT Pub. Date: Dec. 6, 2012

(65) Prior Publication Data
US 2014/0186990 A1   Jul. 3, 2014

(30) Foreign Application Priority Data

Jun. 3, 2011 (JP) .................................. 2011-125340
Mar. 30, 2012 (JP) .................................. 2012-081778

(51) Int. Cl.
*H01L 31/18* (2006.01)
*C23C 16/34* (2006.01)
(Continued)

(52) U.S. Cl.
CPC ........ *H01J 37/3255* (2013.01); *C23C 16/345* (2013.01); *C23C 16/45563* (2013.01);
(Continued)

(58) Field of Classification Search
CPC ......... H05H 1/2406; H05H 2001/2418; H05H 2001/2412; H05H 2001/2431;
(Continued)

(56) References Cited

U.S. PATENT DOCUMENTS 5,130,170 A * 7/1992 Kanai ..................... C23C 16/50
                                                              136/258
5,397,395 A * 3/1995 Sano ..................... C23C 16/545
                                                              118/718
(Continued)

FOREIGN PATENT DOCUMENTS

CN             1126939        7/1996
CN           101183292        5/2008
(Continued)

OTHER PUBLICATIONS

Japanese Office Action dated Aug. 3, 2016 in corresponding Japanese Patent Application No. 2012-546277 with English translation of Japanese Office Action.
(Continued)

*Primary Examiner* — Mary Wilczewski
(74) *Attorney, Agent, or Firm* — Young & Thompson

(57) ABSTRACT

Heretofore, silicon nitride film formed by low pressure plasma CVD has been used for an antireflection film of a solar battery. But it is difficult to reduce the production cost of a solar battery, because, in a low pressure process, facility cost and process cost are expensive. As disclosed, a nitride film is formed by atmospheric pressure plasma CVD using dielectric barrier discharge generated by a plasma head where a plurality of plasma head unit parts is installed in parallel to generate plasma by applying electric field or magnetic field via a dielectric member. Stable glow discharge is formed even under atmospheric pressure by dielectric barrier discharge. And nitride film deposition under atmospheric pressure and low cost production of a solar battery is materialized by using dielectric barrier discharge and by reacting different plasmas generated from plasma supply openings laying side-by-side.

10 Claims, 12 Drawing Sheets

(51) Int. Cl.
*C23C 16/50* (2006.01)
*H01J 37/32* (2006.01)
*C23C 16/455* (2006.01)
*H01L 31/0216* (2014.01)
*H05H 1/24* (2006.01)
*H01L 21/02* (2006.01)

(52) U.S. Cl.
CPC .. *C23C 16/45574* (2013.01); *C23C 16/45595* (2013.01); *C23C 16/50* (2013.01); *H01L 31/02168* (2013.01); *H05H 1/2406* (2013.01); *H01L 21/0217* (2013.01); *H01L 21/02274* (2013.01); *H05H 2001/245* (2013.01); *H05H 2001/2418* (2013.01); *H05H 2001/2431* (2013.01); *H05H 2001/2456* (2013.01)

(58) Field of Classification Search
CPC ..... H05H 2001/2443; H05H 2001/245; H05H 2001/2456; C23C 16/50; C23C 16/345; C23C 16/45563; C23C 16/45574; C23C 16/45595; H01L 21/02274; H01L 21/0217; H01L 31/02168; H01J 37/3255
USPC .............. 438/792; 118/723 R, 723 MP
See application file for complete search history.

(56) References Cited

U.S. PATENT DOCUMENTS

| | | | | |
|---|---|---|---|---|
| 5,514,217 A * | 5/1996 | Niino | ............. | C23C 16/511 118/718 |
| 5,698,164 A | 12/1997 | Kishioka et al. | | |
| 6,194,036 B1 * | 2/2001 | Babayan | ............. | C23C 16/513 427/563 |
| 7,514,377 B2 * | 4/2009 | Sato | ............. | C01B 13/11 118/723 E |
| 8,552,335 B2 * | 10/2013 | Rego | ............. | H05H 1/2406 219/121.52 |
| 9,192,040 B2 * | 11/2015 | Ehlbeck | ............. | H05H 1/24 |
| 9,287,091 B2 * | 3/2016 | Koo | ............. | H01J 37/32366 |
| 9,339,783 B2 * | 5/2016 | Fridman | ............. | A61L 2/0011 |
| 2003/0031610 A1 * | 2/2003 | Ricatto | ............. | B01J 19/088 422/186.04 |
| 2003/0031910 A1 * | 2/2003 | Satou | ............. | H01M 8/1213 264/42 |
| 2003/0051667 A1 * | 3/2003 | Tamagaki | ............. | C23C 14/541 118/726 |
| 2004/0121086 A1 * | 6/2004 | Takagi | ............. | C23C 16/4402 427/573 |
| 2004/0247886 A1 * | 12/2004 | Kudo | ............. | B05D 1/62 428/421 |
| 2005/0126159 A1 * | 6/2005 | Cho | ............. | F01N 3/2066 60/275 |
| 2006/0156983 A1 * | 7/2006 | Penelon | ............. | A61L 2/14 118/723 E |
| 2008/0308535 A1 * | 12/2008 | Rego | ............. | H05H 1/2406 219/121.52 |
| 2009/0188626 A1 * | 7/2009 | Lu | ............. | H05H 1/24 156/345.35 |
| 2009/0188961 A1 * | 7/2009 | Nakagame | ............. | B65H 20/02 226/97.1 |
| 2009/0236042 A1 | 9/2009 | Wada et al. | | |
| 2009/0243010 A1 | 10/2009 | Nishikawa et al. | | |
| 2009/0286010 A1 * | 11/2009 | Erlat | ............. | C23C 16/5096 427/569 |
| 2009/0291233 A1 * | 11/2009 | Takahashi | ............. | B05D 1/60 427/569 |
| 2010/0098600 A1 * | 4/2010 | Liu | ............. | H05H 1/2406 422/186.04 |
| 2010/0105195 A1 * | 4/2010 | Roca I Cabarrocas | ............. | H01J 37/32192 438/485 |
| 2011/0195203 A1 * | 8/2011 | Fujinami | ............. | C23C 16/345 427/577 |
| 2011/0315320 A1 * | 12/2011 | Do | ............. | C23C 16/45565 156/345.34 |
| 2012/0000609 A1 * | 1/2012 | Do | ............. | H01J 37/32091 156/345.48 |
| 2012/0100524 A1 * | 4/2012 | Fridman | ............. | A61L 2/0011 435/2 |
| 2012/0115314 A1 * | 5/2012 | Sakamoto | ............. | C23C 16/24 438/479 |
| 2013/0053760 A1 * | 2/2013 | Ehlbeck | ............. | H05H 1/24 604/23 |
| 2014/0162338 A1 * | 6/2014 | Schaefer | ............. | H05H 1/2406 435/173.1 |
| 2014/0186990 A1 * | 7/2014 | Kusuhara | ............. | H05H 1/2406 438/72 |
| 2014/0311891 A1 * | 10/2014 | Fridman | ............. | A61L 2/0011 204/164 |
| 2016/0193373 A1 * | 7/2016 | Fridman | ............. | A61L 2/0011 250/492.1 |

FOREIGN PATENT DOCUMENTS

| | | | | |
|---|---|---|---|---|
| DE | 10 2011 076 806 | * 12/2012 | ............. | H05H 1/46 |
| EP | 2 717 657 | * 9/2014 | ............. | H05H 1/24 |
| JP | 58-220477 | 12/1983 | | |
| JP | 63-050025 | 3/1988 | | |
| JP | 5-190137 | 7/1993 | | |
| JP | 2002-158219 | 5/2002 | | |
| JP | 2003-132847 | 5/2003 | | |
| JP | 2004-76076 | 3/2004 | | |
| JP | 2004-128417 | 4/2004 | | |
| JP | 2005-203291 | * 7/2005 | ............. | H05F 3/04 |
| JP | 2006-100551 | 4/2006 | | |
| JP | 2007-173197 | 7/2007 | | |
| JP | 2007-273752 | 10/2007 | | |
| JP | 2009-260281 | 11/2009 | | |
| JP | 2011-108615 | 6/2011 | | |
| WO | WO 98/08592 | * 8/1997 | ............. | B01D 53/32 |
| WO | WO 2010/107722 | * 9/2010 | ............. | H01J 19/08 |
| WO | WO 2012/163876 | * 12/2012 | ............. | H05H 1/24 |
| WO | WO 2012/165583 | * 12/2012 | ............. | H05H 1/24 |

OTHER PUBLICATIONS

International Search Report—PCT/JP2012/064176—dated Aug. 21, 2012.
Chinese Official Action—201280027217.0—dated Nov. 1, 2016.

* cited by examiner (a)

(b)

(c)

(a)

(b)

(a)

(b)

(c)

(a)

(b)

(c)

(a)

(b)

(c)

CVD APPARATUS AND METHOD FOR FORMING CVD FILM

TECHNICAL FIELD

The present invention relates to an atmospheric CVD apparatus using dielectric-barrier discharge plasma and a method for forming CVD film using the plasma, and more particularly, a method for forming a nitride film using an atmospheric CVD apparatus.

CITATION LIST

Patent Documents

Patent Document 1: Japanese Unexamined Patent Application Publication No. 1983-220477
Patent Document 2: Japanese Unexamined Patent Application Publication No. 2002-110671
Patent Document 3: Japanese Unexamined Patent Application Publication No. 2002-176119
Patent Document 4: Japanese Unexamined Patent Application Publication No. 2008-98128
Patent Document 5: Japanese Unexamined Patent Application Publication No. 2004-39993
Patent Document 6: Japanese Unexamined Patent Application Publication No. 1988-50025

BACKGROUND ART

In recent years, solar power generation has been widely used as clean energy serving as a substitute for oil-based energy having many problems such as resource depletion and the emission of greenhouse gases. Patent document 1 discloses a method to enhance energy conversion efficiency by using silicon nitride film for an antireflection film of a silicon solar battery. Previously, in plasma CVD processing to forma silicon nitride film, a deposition process has been done under reduced pressure of $10^{-2}$ to several Torr in order to create stable plasma. Therefore, production cost reduction has been difficult because an expensive equipment and pressure reduction process in a deposition chamber are necessary. For more widespread use of solar power generation, it has been desired to develop a CVD apparatus and a production method to produce solar battery at lower cost.

Patent document 2 discloses a technology to produce a thin film by atmospheric CVD. FIG. 12 shows a cross-sectional diagram of an existing atmospheric CVD apparatus disclosed in patent document 2. In general, it is known that stable plasma state cannot be kept under atmospheric pressure when most gases are used except specific gases such as helium, and the plasma state instantly moves into an arc discharge state. In a CVD apparatus as illustrated in FIG. 12, a pair of electrodes 114 and 115 are placed facing each other in a chamber 111. And material gases are introduced from gas inlets 111 and plasma 118 is generated via solid dielectric members 116, 117 by applying electric field on electrodes 114, 115. Then a thin film 120 is formed on a substrate 121 by the plasma 118 being sprayed from a supply opening 119. Stable glow discharge plasma can be generated regardless of the difference of gas by applying electric field of the electrode via solid dielectric body. A method to form a nitride film is described in embodiment 3 of Patent Document 2. In this method, plasma is generated by introducing a mixture gas of silane gas and ammonia gas diluted by argon gas into a container 111. However, silicon plasma and nitrogen plasma do not react on the substrate but mainly react in the container according to this method. Therefore almost no nitride film can be formed on the substrate.

In Patent Document 3, a technology to produce thin film by atmospheric CVD is also disclosed. The deposition method disclosed in Patent Document 3 is film deposition in discharged space, while the deposition method disclosed in Patent Document 2 is film deposition by plasma spray. Accordingly, a nitride film deposition on the substrate becomes possible, but a difference of film deposition rate between regions around gas inlet and gas outlet becomes notable. This has lowered the film deposition uniformity when several different gases are introduced in those cases such as a nitride film deposition. And a substrate is subject to damage from plasma because the substrate is placed in a discharged space.

DISCLOSURE OF INVENTION

Problem to be Solved by the Invention

The object of this invention is to provide an atmospheric CVD apparatus which enables film formation with high deposition rate and high uniformity. The object of this invention is mainly to provide a CVD apparatus which enables nitride film formation under atmospheric pressure.

Means for Solving Problem

Present invention (1) is a plasma CVD apparatus wherein a desired number of flow passage plates are stacked and discharge electrodes are placed at the gas outlet side of the flow passage plates, each discharge electrode composed of a ceramic member having a hollow portion where an electrode wire is placed without contact with the ceramic member.

In one embodiment, a gas flow passage is formed along the side of the flow passage plate.

Present invention (3) is the plasma CVD apparatus wherein the hollow portion is in a vacuum state.

In a different embodiment, gas is enclosed in the hollow portion and the gas is noble gas.

In another embodiment, the pressure in the hollow portion is reduced to less than or equal to 250 Torr.

In a further embodiment, the noble gas is Ar or Ne.

In a further embodiment, one terminal of the electrode wire was connected to a metal foil, the end of the metal foil functions as an external extraction terminal, and the metal foil is sealed in contact with narrowed part of the ceramic member.

In another embodiment, the electrode wire is made of Ni or Ni alloy.

In yet another embodiment, the electrode wire is made of W including Th or ThO.

In yet a further embodiment, the content of Th is less than or equal to 4 weight %.

In a further embodiment, the electrode wire is formed with coil-like shape.

In another embodiment, a layer made of emitter material is formed on the surface of the electrode wire, and the emitter material is material with smaller work function than the material of the electrode.

In yet another embodiment, the emitter material is material with perovskite-type crystal structure.

In yet a further embodiment, the emitter material is more than or equal to one chemical compound selected from the chemical compound group comprising TiSrO, MgO, TiO.

In a further embodiment, the emitter layer is formed by a process wherein material of emitter layer is torn into pieces in a mortar, and resultant powder is solved in water, and the solution mixed with glue is coated on the surface of the electrode wire, and emitter layer is formed by sintering of coated wire.

In another embodiment, the emitter layer is formed by MOCVD.

In yet another embodiment, the metal foil is made of Mo or Mo alloy.

Present invention (18) is a plasma CVD apparatus wherein a desired number of flow passage plates are stacked and discharge electrodes are placed at the gas outlet side of the flow passage plates, each discharge electrode composed of a ceramic member where an electrode wire or a metal foil are enclosed inside the ceramic member.

In yet a further embodiment, a gas flow passage is formed along the side of the flow passage plate.

In a further embodiment, the metal foil is made of Mo or Mo alloy.

In another embodiment, the ceramic member is made of quartz.

In yet another embodiment, the ceramic member is made of translucent alumina.

In yet a further embodiment, the flow passage plate is made of heat resisting metal.

In a further embodiment, the flow passage plate was made of ceramic.

In another embodiment, the flow passage plate is equipped with a mortise at the gas outlet side, the discharge electrode is equipped with a tenon at one side, and the discharge electrode is connected with the flow passage plate by setting in using tenon and mortise.

In yet another embodiment, the discharge electrode is connected with the flow passage plate using a retainer.

In yet a further embodiment, the flow passage plate and the discharge electrode are fabricated by integral molding.

In a further embodiment, the gas flow passage the flow passage plate is processed after the integral molding of the flow passage plate and the discharge electrode.

In another embodiment, the gas flow passage the flow passage plate is processed at the same time as the integral molding of the flow passage plate and the discharge electrode.

In yet another embodiment, a substrate is placed facing to the discharge electrode.

In yet a further embodiment, the substrate can be conveyed.

In a further embodiment, the substrate is a substrate with band-like shape which is conveyed by roll-to-roll process.

In another embodiment, the apparatus is an apparatus for the deposition of silicon nitride film.

In yet another embodiment, the apparatus is an apparatus for the deposition of silicon film.

In yet a further embodiment, at least nitrogen source gas and silicon source gas are supplied through the flow passage plates, and nitrogen source gas and silicon source gas are respectively supplied through different flow passage plates.

In a further embodiment, at least mixed gas of nitrogen source gas and silicon source gas is supplied through the flow passage plates.

In another embodiment, the silicon nitride film or silicon film is deposited consecutively.

In yet another embodiment, the gas outlet is placed downward.

In yet a further embodiment, the gas outlet is placed toward lateral direction.

In a further embodiment, deposition process is carried out while positive bias voltages and negative bias voltages are alternatively applied to a plurality of neighboring discharge electrodes and negative voltage is applied to the substrate.

In another embodiment, deposition process is carried out while positive bias voltages and negative bias voltages are alternatively applied to a plurality of neighboring discharge electrodes and the substrate is set to be floating potential.

In yet another embodiment, deposition process is carried out while positive bias voltage is applied to a plurality of discharge electrodes and negative voltage is applied to the substrate.

In yet a further embodiment, deposition process is carried out while a dielectric substrate is placed under the substrate, and positive bias voltage is applied to the dielectric substrate.

In a further embodiment, deposition process is carried out while the discharge electrode is cooled down by noble gas or inert gas.

In another embodiment, plasma was generated under RF or pulse electric field at lower or higher frequency than 13.56 MHz.

In yet another embodiment, a movable quartz member is fit in a space in the gas passage.

Present invention (47) is a discharge electrode composed of a ceramic member having a hollow portion where an electrode wire is placed without contact with the ceramic member In yet a further embodiment, the hollow portion is in vacuum state.

In a further embodiment, gas is enclosed in the hollow portion and the gas is noble gas.

In another embodiment, the pressure in the hollow portion is reduced to less than or equal to 250 Torr.

In yet another embodiment, the noble gas is Ar or Ne

In yet a further embodiment, one terminal of the electrode wire was connected to a metal foil, the end of the metal foil functions as an external extraction terminal, and the metal foil is sealed in contact with narrowed part of the ceramic member.

In a further embodiment, the electrode wire is made of Ni or Ni alloy.

In another embodiment, the electrode wire is made of W including Th or ThO.

In yet another embodiment, the content of Th is less than or equal to 4 weight %.

In yet a further embodiment, the electrode wire is formed with coil-like shape.

In a further embodiment, a layer made of emitter material is formed on the surface of the electrode wire, and the emitter material is material with smaller work function than the material of the electrode.

In another embodiment, the emitter material is material with perovskite-type crystal structure.

In yet another embodiment, the emitter material is more than or equal to one chemical compound selected from the chemical compound group comprising TiSrO, MgO, TiO.

In yet a further embodiment, the emitter layer is formed by a process wherein material of emitter layer is torn into pieces in a mortar, and resultant powder is solved in water, and the solution mixed with glue is coated on the surface of the electrode wire, and emitter layer is formed by sintering of coated wire.

In a further embodiment, the emitter layer is formed by MOCVD.

In another embodiment, the metal foil is made of Mo or Mo alloy.

Present invention (63) is a method for forming CVD film using the plasma CVD apparatus according to any of the previously described embodiments.

Effect of the Invention

According to present invention (1), (6), (7), (47), (51), (52), (63), stable glow discharge plasma can be generated even under atmospheric pressure, then high rate deposition of nitride film with excellent uniformity in film thickness. Low cost mass production of solar battery can be achieved.

According to present invention (2)-(5), (48)-(50), stable plasma generation due to glow discharge can be more easily achieved.

According to present invention (8)-(10), (53)-(55), the work function of an electrode wire can be reduced so as to enhance thermal electron emission.

According to present invention (11), (56), discharge area can be enlarged due to the increase in the surface area of an electrode wire.

According to present invention (12)-(15), (57)-(60), electrons are emitted not only from an electrode wire but also from emitter material so that discharge starts by lower power supply and discharge state after the start becomes more stable.

According to present invention (16), (61), the space in a coil can be sufficiently filled by emitter material. And emitter material can be formed more densely, and its compositional ratio can be improved.

According to present invention (17), (62), adhesion of the metal foil with ceramic member can be improved.

According to present invention (18), stable glow discharge plasma can be generated even under atmospheric pressure, then high rate deposition of nitride film with excellent uniformity in film thickness. Low cost mass production of solar battery can be achieved. And the electrode does not have a hollow portion so that it is easier to fabricate a CVD apparatus.

According to present invention (19)-(22), stable plasma generation due to glow discharge can be more easily achieved.

According to present invention (23), thermal deformation of the flow passage plate can be prevented due to heat producing electrode.

According to present invention (24), ceramic is excellent heat resisting material and the difference of its coefficient of thermal expansion from that of an electrode is small.

According to present invention (25), existing flow passage plates can be utilized.

According to present invention (26), tenon and mortise processing is not necessary and quick-release is possible.

According to present invention (27)-(29), it becomes easier to fabricate the apparatus.

According to present invention (30), stable glow discharge plasma can be generated more easily.

According to present invention (31), (32), a large area film with excellent uniformity in thickness can be deposited.

According to present invention (33), (34), low cost production of useful electronic devices such as a solar battery.

According to present invention (35), silicon nitride film and silicon film with high purity can be deposited using a single apparatus.

According to present invention (36), the configuration of an apparatus can be simplified.

According to present invention (37), a large area film with excellent uniformity in thickness can be deposited.

According to present invention (38), the uniformity of deposited film can be improved.

According to present invention (39), installation area of an apparatus can be minimized.

According to present invention (40), stable glow discharge plasma can be generated more easily. Deposition rate can be enhanced because plasma can be generated in larger region. And the collision damage to the substrate by positive ions such as Ar ions can be weakened. The damage of deposited thin film on the substrate can be reduced so that denser thin film can be formed.

According to present invention (41), (42), stable glow discharge plasma can be generated more easily.

According to present invention (43), the collision damage to the substrate by positive ions such as Ar ions can be weakened. The damage of deposited thin film on the substrate can be reduced so that denser thin film can be formed.

According to present invention (44), the over-heat of the discharge electrode can be prevented.

According to present invention (45), power supply at frequency other than 13.56 MHz which is commonly used in a plasma apparatus can be utilized for a deposition process. By controlling the frequency, it is possible to minimize the damage to a thin film on the substrate.

According to present invention (46), it is possible to control the cross-sectional area of a gas passage so that plasma state or film deposition state can be optimized.

Figure 1:
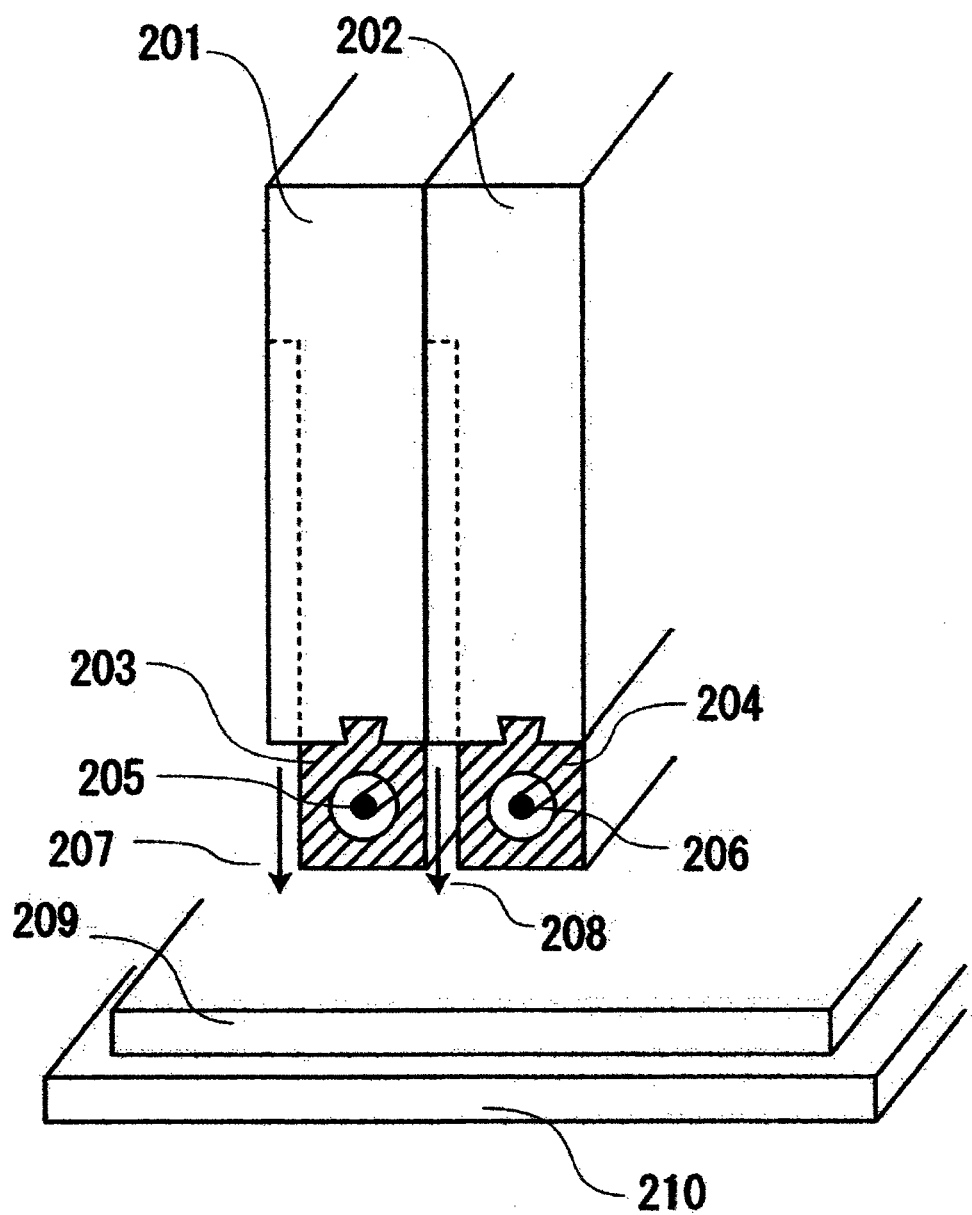
FIG. 1 is a diagram of the structure of an electrode in a CVD apparatus according to the present invention.

DESCRIPTION OF THE SYMBOLS 1, 2, 3: plasma head unit member
4, 11, 15: gas inlet
5, 12, 16: dielectric member
6, 13, 17: plasma generation passage
7, 14, 18: plasma supply opening
8, 9: electrode
10: shock absorbing member
21, 22, 23: plasma head unit member
24, 35: gas distribution passage
25, 33: dielectric member
26, 36: plasma generation passage
27, 37: plasma supply opening
28, 29: electrode
30: shock absorbing member
31: gas distribution passage region
32: plasma generation passage region
34: gas supply pipe
41, 47, 51: gas introduction opening
42, 48, 52: dielectric member
43, 49, 53: plasma generation passage
44, 50, 54: plasma supply opening
45, 46: electrode
61, 66, 71: gas introduction opening
62, 67, 72: dielectric member
63, 68, 73: plasma generation passage
65, 70, 75: plasma supply opening
64, 69, 74: induction coil
81, 88, 95: gas introduction opening
82, 89, 96: dielectric member
83, 90, 97: plasma generation passage
85, 91, 98: plasma supply opening
84, 92, 99: induction coil
86, 87, 93, 94: coil terminal
101, 102: source gas supply unit
103: power source
104: plasma head
105, 106: plasma
107: plasma reaction region
108: thin film
109: substrate
110: substrate conveyance unit
111: gas introduction opening
112: power source
113: container
114, 115: electrode
116, 117: solid dielectric body
118: plasma
119: plasma supply opening
120: thin film
121: substrate
201, 202: flow passage plate
203, 204: quartz member
205, 206: electrode wire
207, 208: gas flow direction
209: substrate
210: support member
211, 215: quartz member
212, 216: electrode wire
213, 217: electrode lead wire
214: opening
218: enclosing member
301, 306, 311, 321: flow passage plate
302, 307, 312, 322: discharge electrode
303, 308, 313, 323: plasma
304, 309, 314, 324: substrate
305, 310, 315, 325: dielectric substrate
326: electrode for applying bias voltage
327: power source for applying bias voltage
328: positive argon ion
331, 335, 339: flow passage plate
332, 336, 340: flow passage
333, 334, 337, 338, 341, 342: dielectric member

BEST MODE EMBODIMENTS FOR CARRYING OUT THE INVENTION

Best mode embodiments for carrying out the present invention are described in detail as follows.

(Glow Discharge by Dielectric-Barrier Discharge)

Inventors of the present invention have earnestly studied plasma deposition for realization of silicon nitride CVD under atmospheric pressure. First they have employed plasma-blowing deposition for preventing plasma damage on a substrate, and have employed plasma formation by dielectric-barrier discharge for stable glow discharge. In order to prevent plasma reaction in a plasma generation chamber which was a problem of conventional method, a plasma head, which is a plasma generation member, is composed of a plurality of unit parts respectively having an independent plasma blow opening. For example, silicon plasma and nitrogen plasma are generated separately in each unit part in silicon nitride CVD process. Furthermore inventors have discovered that the parallel configuration wherein a unit part for silicon plasma generation is placed next to a unit part for nitrogen plasma generation is effective for improvement in uniformity of deposited film. Plasma supplied from a blow opening does not react in a plasma head, but it reacts in a space between a blow opening and a substrate to deposit silicon nitride film. Therefore highly effective silicon nitride deposition on a substrate becomes possible. And also, material gases are supplied independently to each unit parts of the plasma head, and electrodes are placed so that electrical energy can be controlled independently which is applied for plasma generation. By these arrangements, thin film deposition becomes possible using best conditions for each plasma generation.

And also, in conventional method, there is a problem that it is difficult to generate continuously stable plasma when plasma is generated under atmospheric pressure. Inventors of the present invention have taken notice of the structure of an electrode and the structure of apart where a substrate is placed. And they have discovered that stable plasma generation, the enhancement of nitride film deposition rate, and the improvement of reproducibility in film thickness and film quality become possible by the arrangement wherein an electrode is enclosed in a quartz member, and the electrode is separated from the quartz member by empty space, and a substrate is placed on a quartz supporting member, and plasma is supplied from a plasma head to the substrate.

In addition, "atmospheric pressure" in this specification specifically means pressure between $8 \times 10^4$ and $12 \times 10^4$ Pa, while it depends on the atmospheric pressure and the altitude of the place where the CVD apparatus is placed. When the pressure of CVD process is within this range, it is possible to reduce facility cost because expensive equipment for compression and decompression is not needed.

(Specific Example of an Electrode Structure)

FIG. 1 is a diagram of the structure in a CVD apparatus according to the present invention. Quartz members 203, 204 are placed in the gas blowout openings of flow passage plates 201, 202 where process gas flows, and electrode wires 205, 206 are placed in the hollow portion of the quartz members 203, 204. Electrical energy due to discharge between electrode wires 205, 206 and a substrate 209 is applied to gas molecules of process gas which blows out from the gas blowout openings of flow passage plates 201, 202. Then the molecules are transformed into plasma which is supplied to the substrate 209, and silicon nitride film is deposited on the substrate 209 by the reaction of ions in the plasma. Electrode wires 205, 206 are preferably placed in the hollow portion of the quartz members 203, 204 without direct contact between them. The ambient of the hollow portion is preferably vacuum state or low-pressure state. When the ambient is low-pressure state, gas enclosed in the hollow portion is preferably noble gas such as Ar, or Ne. Preferable range of the low pressure is less than or equal to 250 Torr. Plasma is spontaneously generated by less power supply, and stable plasma generation becomes possible by uniform discharge when the hollow portion is evacuated or depressurized at the pressure less than or equal to 250 Torr with the ambient of noble gas. Flow passage plates 201, 202 are fabricated, for example, by processing aluminum plate. The substrate 209 is preferably placed on a quartz supporting member 210. Then the stability of plasma is enhanced. The shape of the quartz members 203, 204 is not limited to the specific shape if they have long hollow part so that linear electrode can be placed inside. The cross-sectional shape of the hollow portion is not limited to the specific shape, but it is preferably a circle. And the quartz members are preferably equipped with convex parts so that they can be set in the flow passage plates. The flow passage plates are equipped with concave parts corresponding to the convex parts. Alternatively, the quartz members can be equipped with concave parts and the flow passage plates can be equipped with convex parts corresponding to the concave parts.

And also, electrodes can be placed under the supporting member 210 for controlling bias voltage applied to the plasma. In this case, electrodes placed above the substrate 209, such as electrodes 205, 206, are called as upper electrodes, and electrodes placed under the substrate 209 (under the supporting member 210) are called as lower electrodes.

As shown in FIG. 1, main body of a flow passage plate and an electrode can be fabricated as separate parts, and can be set in using tenon and mortise. Alternatively, an electrode can be placed under the flow passage plate using a retainer. A process to make mortise trench is not necessary, and it becomes easier to remove and replace these parts. And also, main body of a flow passage plate and an electrode can be fabricated by integral molding. The process to fabricate an apparatus becomes easier. A flow passage can be processed after the integral molding of a flow passage plate and an electrode. Or it can be processed at the same time as the integral molding.

It is found that plasma is not generated when nitrogen or ammonia gas which is process gas for nitride film deposition is introduced from the beginning of the process, but plasma can be generated when Ar gas is introduced. Therefore, it is found that plasma which is necessary for nitride film deposition can be stably generated by process steps characterized in that plasma is generated by introducing Ar gas first, and then the number of electrons is increased, and then the flow rate of nitrogen or ammonia gas is gradually increased.

In the embodiment as shown in FIG. 1, electrode wires are not placed in direct contact with quartz members, and they are placed as floating status in a hollow portion. Alternatively, electrode wires can be placed in direct contact with quartz members without making a hollow portion, which makes fabrication of plasma head easier. The material of electrode wires or metal foil is preferably Mo or Mo alloy. Mo or Mo alloy is highly adhesive with ceramics.

The material of an insulating member of the electrode which corresponds to the above-mentioned members 203, 204 is preferably ceramics in both cases where a hollow portion is prepared or not around the electrode. Furthermore the material is preferably quartz or translucent alumina. And the material of the flow passage plate is preferably heat-resistant metal or ceramics.

The structure of an electrode used in the conventional CVD apparatus is the structure where carbon members are exposed, so there is a leakage problem of impurities included in carbon material. Meanwhile, there is no leakage problem of impurities in the structure of the electrode according to the present invention wherein an electrode wire is covered by a quartz tube.

The material of an electrode wire is preferably W. It is more preferably W which contains Th or ThO. The content of Th is preferably less than or equal to 4% by weight. This arrangement reduces the work function of the electrode wire, and facilitates the emission of thermal electrons so that plasma can be easily generated.

It is preferable that an electrode wire is entirely heated by appropriate external current supply to the wire. When the temperature of the wire is low, nitride or silicon film can be deposited on the surface of the electrode. Then it is not preferable because the flow passage may be reduced in thickness or clogged up. To the contrary, it is possible to prevent the growth of deposited material on the surface of the electrode by heating it. And also, it is possible to control the work function of metal such as Th or PTO which is added to electrode material such as W by controlling the temperature of the electrode. By these arrangements, electron density emitted from metal can be controlled so that CVD process can be controlled more precisely.

And radioactive material is preferably coated on the surface of electrode material. For example, strontium is preferably coated. Plasma can be easily excited by coating radioactive material.

And also, material with smaller work function than the material of the electrode is preferably used as emitter material, and a layer of the emitter material is preferably formed on the surface of the electrode wire. Material with perovskite-type crystal structure is preferably used as the emitter material. And more than or equal to one chemical compound selected from the chemical compound group comprising TiSrO, MgO, TiO is preferably used as the material. Any of these arrangements reduces the work function of the electrode wire, and facilitates the emission of thermal electrons so that plasma can be easily generated.

The emitter layer is formed by a process wherein material of emitter layer is torn into pieces in a mortar, and resultant powder is solved in water, and the solution mixed with glue is coated on the surface of the electrode wire, and emitter layer is formed by sintering of coated wire. Or it can be formed by MOCVD. When the electrode wire is formed with coil-like shape, space formed in the electrode can be sufficiently filled by emitter material. And the emitter layer can be formed more densely, and its composition ratio can be improved.

And also, a quartz electrode placed in a quartz member is preferably used not only for an electrode for high frequency radiation but also used for a heater. The temperature control of a body on which deposition film is formed can be controlled, for example, by heating, by using the quartz electrode as a heater.

(Method for Fabricating an Electrode)

Figure 2:
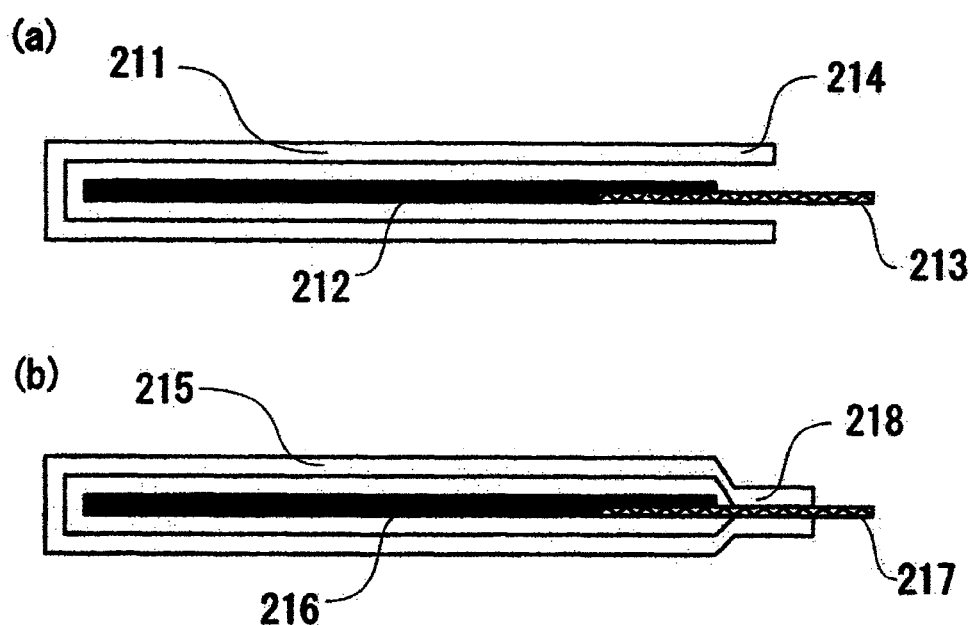
FIGS. 2(a), (b) are diagrams to show process steps to fabricate the electrode in a CVD apparatus according to the present invention.

FIGS. 2(a), (b) are diagrams to show process steps to fabricate the electrode in a CVD apparatus according to the present invention. First, as shown in FIG. 2(a), a quartz member 214 with a hollow portion is prepared having one terminal with an opening 214 and the other closed terminal. As an electrode wire 212, for example, a wire made of Ni or Ni alloy is used. In FIG. 2, a linear electrode wire is shown, but an electrode wire with coil-like shape is preferably used. The surface area of the electrode can be enlarged, and the discharge area can be also enlarged by using an electrode with coil-like shape. A lead wire 213 is attached on the terminal of an electrode 212. As a lead wire, for example, metal foil with a thickness of about 20 μm made of Mo or Mo alloy is used. Next, the inside of the quartz member 211 is depressurized until the pressure reaches to vacuum or less than or equal to 250 Torr. Then the opening 214 is enclosed as shown in FIG. 2(b). According to these process steps, an electrode member is completed where an electrode 216 is supported by a lead wire 217 in a floating state without contact with a quartz member 215.

Noble gas such as Ar or Ne is preferably used for filler gas when a hollow portion is depressurized. It is more preferable that clean gas such as Ar with impurity concentration less than or equal to 10 ppb is introduced as purge gas into the hollow portion before the filler gas is introduced.

(The First Specific Example of a Unit Part of a Plasma Head)

FIGS. 5(a), (c) is respectively a front view diagram and a side view diagram of a plasma head according to the first specific example of the present invention. The first specific example of a unit part is a unit part of a plasma head to generate capacitance coupling plasma. The unit part comprises a dielectric member 42 and a pair of electrodes 45, 46 which hold a dielectric member 42. The dielectric member 42 is equipped with a hole which passes through from top down, and the hole functions as a plasma generation passage. The dielectric member 42 can be formed as an integral member, or it can be formed by pasting or fitting a plurality of members together. When the dielectric member is composed of a plurality of members, it is preferably processed so that no leakage occurs at a joint part. One end of the hole is used as a gas introduction opening 41. Then electrical field is applied to the electrode 45, 46 which provides electrical energy to introduced gas molecules to generate plasma made of radicals, ions, and electrons. Constant, high-frequency, or pulsed electrical field can be preferably applied. Especially, pulsed electrical field can be preferably applied. Electrical field is applied via dielectric member, so even when constant electrical field is applied, accumulation and extinction of charge are repeated one after the other on the surface of dielectric member. Accordingly, plasma discharge state does not reach to be arc discharge but becomes stable glow discharge. Generated plasma blows out from plasma supply opening 50 which is the other end of the hole. The range where plasma is supplied depends on the condition of plasma generation, but generally speaking, plasma is supplied in the range of several mm-several cm from plasma supply opening 50. As shown in the side view diagram of FIG. 3(b), the unit part can be equipped with one plasma supply opening. And as shown in FIG. 5(c), it can be equipped with a plurality of plasma supply openings. When a deposition process is applied on a small substrate, plasma can be supplied from one plasma supply opening. When a deposition process is applied on a large substrate, plasma is preferably supplied from a plurality of plasma supply openings for better uniformity of deposition.

Figure 5:
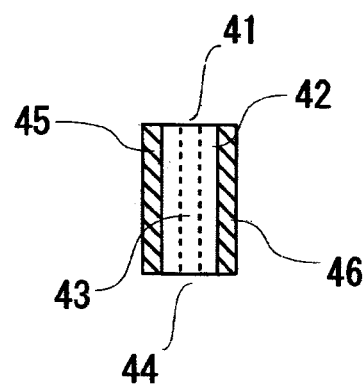
FIG. 5(a) is a front view diagram of a plasma head unit member according to the first specific example of the present invention.
FIGS. 5(b), (c) is a side view diagram of a plasma head unit member according to the first specific example of the present invention.
Figure 5:
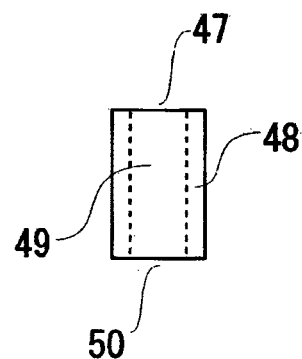
Figure 5:
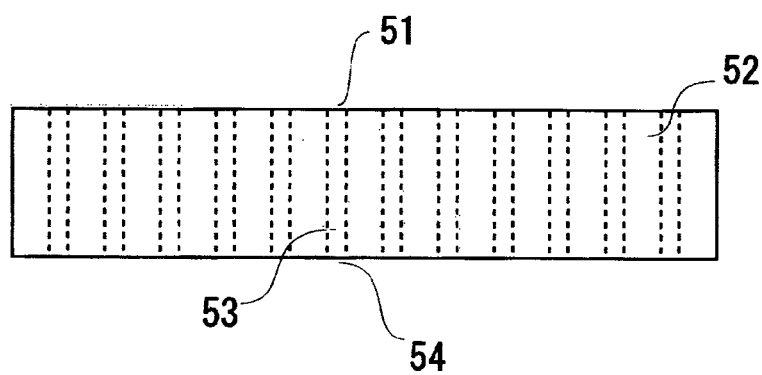

And also it is not necessary that a hole is prepared for a gas passage in dielectric member as shown in FIG. 5. A space between dielectric members can be used as a gas passage when the dielectric members are placed parallel to each other with a space between them.

Material of dielectric members is preferably plastic, glass, carbon dioxide, metal oxide such as aluminum oxide. Especially, quartz glass is preferably used. Dielectric material with relative permittivity greater than or equal to 2 is preferably used. Dielectric material with relative permittivity greater than or equal to 10 is more preferably used. The thickness of dielectric material is preferably in the range from 0.01 mm to 4 mm. If it is too thick, excessively high voltage is necessary for plasma generation. If it is too thin, arc discharge tends to take place.

Material of electrode is preferably metal such as copper, aluminum, stainless-steel or metal alloy. The distance between electrodes, which depends on the thickness of dielectric member and applied voltage, is preferably in the range from 0.1 mm to 50 mm.

(The Structure of a Plasma Head)
(The First Specific Example of a Plasma Head)

Figure 3:
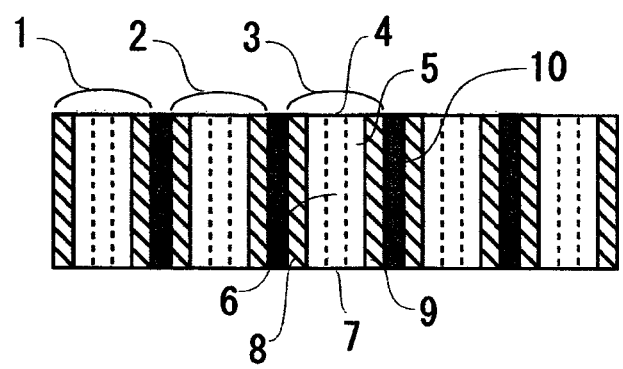
FIG. 3(a) is a front view diagram of a plasma head according to the first specific example of the present invention.
FIGS. 3(b), (c) are side view diagrams of a plasma head according to the first specific example of the present invention.
Figure 3:
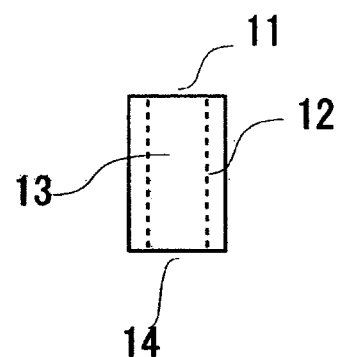
Figure 3:
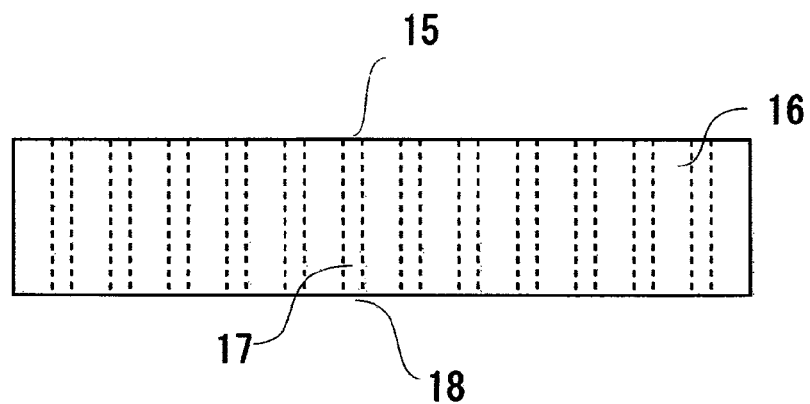

FIG. 3(a) is a front view diagram of a plasma head according to the first specific example of the present invention. FIGS. 3(b), (c) are side view diagrams of a plasma head according to the first specific example of the present invention. Plasma head is formed by sequentially installing one of a plurality of unit parts adjacent to the other including plasma head unit members 1, 2, 3. In FIG. 3(a), plasma head unit parts are placed in parallel by inserting shock absorbing member 10 between the plasma head unit members. The shock absorbing member is not always an indispensable part for the plasma head structure. But it is useful for preventing the damage of dielectric member 5 by inserting the shock absorbing member when the dielectric member 5 is made of material subject to breakage such as glass and a plurality of plasma head unit parts is fixed by clenching. According to the structure of unit parts used, a plasma head can be equipped with one plasma supply opening as shown in the side view diagram in FIG. 3(b), and it can be equipped with a plurality of plasma supply openings as shown in FIG. 3(c).

(The Second Specific Example of a Plasma Head)

Figure 4:
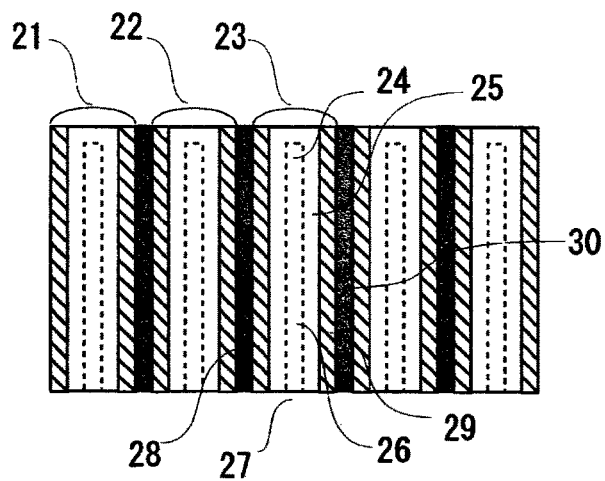
FIGS. 4(a), (b) are respectively a front view diagram and a side view diagram of a plasma head according to the second specific example of the present invention.
Figure 4:
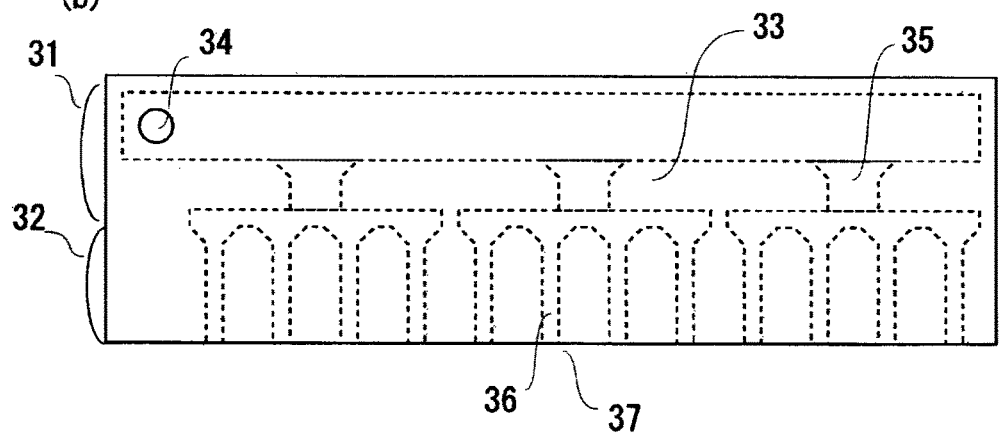

FIGS. 4(a), (b) are respectively a front view diagram and a side view diagram of a plasma head according to the second specific example of the present invention. Plasma head is formed by sequentially installing one of a plurality of unit parts adjacent to the other including plasma head unit members 21, 22, 23. As shown in the side view diagram in FIG. 2(b), plasma head is equipped with a plurality of plasma supply openings. A dielectric member 35 is processed so that it is equipped with a hollow portion inside. This hollow portion functions as a gas distribution passage and a plasma generation passage. A hollow portion can be formed in the dielectric member as an integral part. Or a hollow portion can be formed by that a concave part is formed in one dielectric plate and the other plate is bonded to the former plate. Material gas for plasma generation is supplied from gas supply opening 34. A gas distribution passage region is formed is formed in the upper part of the dielectric member 35, the region which distributes gas supplied from the gas supply opening 34 into a plurality of plasma generation pas sages 36. According to this structure, material gas can be equally supplied to many plasma generation members using a simple structure so as to contribute downsizing of CVD apparatus.

(The Structure of a CVD Apparatus)

Figure 8:
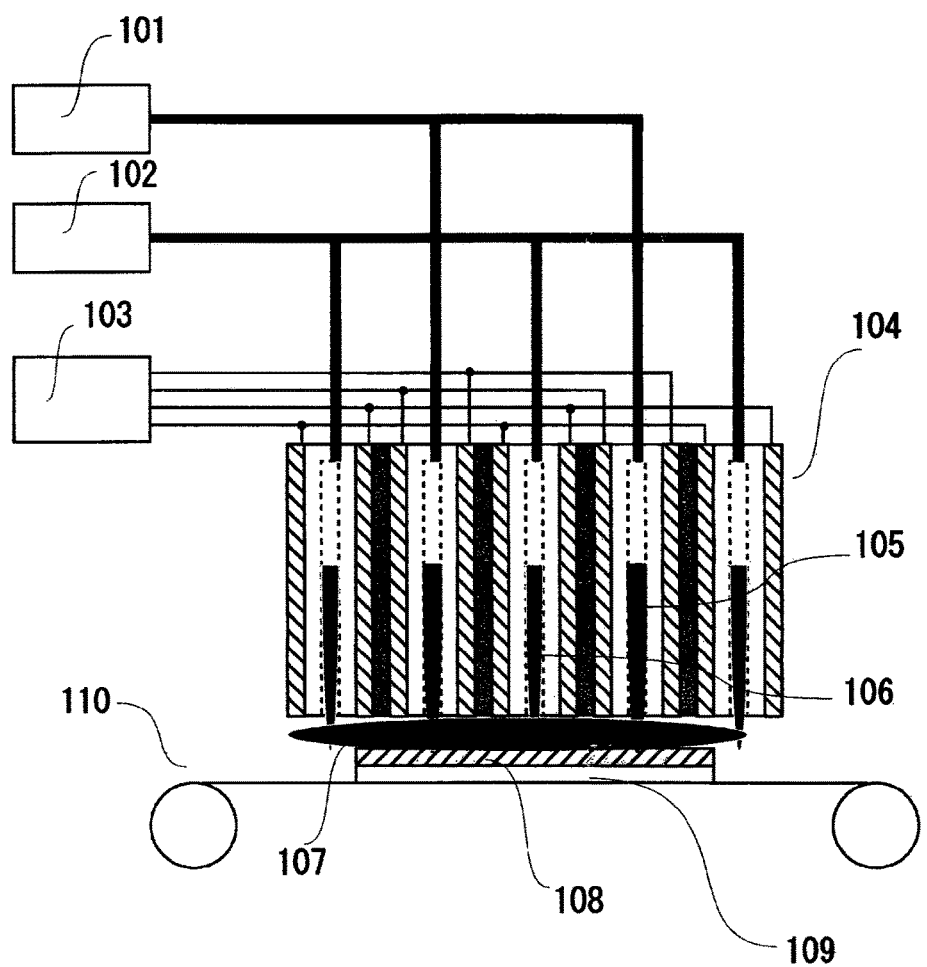
FIG. 8 is a cross-sectional diagram of a CVD apparatus according to the embodiment of the present invention.

FIG. 8 is a cross-sectional diagram of a CVD apparatus according to the embodiment of the present invention. A CVD apparatus consists of a source gas supply unit 101 supplying the first gas, a source gas supply unit 102 supplying the second gas, a plasma head 104 which is formed by sequentially installing a plasma head unit part adjacent to a shock absorbing member, a power supply which supplies electrical power to the plasma head unit part, and a substrate conveyance unit 110 which conveys substrates. A plasma head unit part consists of a dielectric member equipped with plasma generation passage and an electrode. Material gas is introduced from the upper gas introduction opening, and electric field is applied by an electrode via a dielectric member to excite the material gas for generating plasma comprising radicals, ions, and electrons. Generated plasma is supplied from a plasma supply opening to a substrate 109 placed on the substrate conveyance unit 110. A deposition process is carried out while substrates are conveyed by a substrate conveyance unit which enables consecutive deposition. The shape of the substrate is preferably band-like shape which is conveyed by roll-to-roll process. Or another process can be adopted in which a substrate is placed on a static position during deposition process, and after the deposition is finished, the substrate is conveyed so that the next substrate is in the deposition position by the substrate conveyance unit.

In addition, a lower electrode which is not shown in the diagram is placed under the substrate 109, and it can apply bias voltage from under the substrate.

Plasma supply openings can be placed downward as shown in FIG. 8, or they can be placed toward lateral direction. When plasma supply openings are placed downward, the uniformity of deposition can be improved. When they are placed toward lateral direction, the installation area of the apparatus can be minimized.

Because plasma discharge is dielectric barrier discharge, plasma becomes stable glow discharge, and it becomes non-equilibrium plasma where the temperature of electrons is high and that of radicals and ions is low.

When silicon nitride is deposited, for example, silane gas and ammonia gas are used as material gas. Silane gas and ammonia gas are supplied alternately to adjacent plasma head unit parts, and silicon plasma 105 and nitrogen plasma 106 are generated in each plasma generation passage. Silicon plasma and nitrogen plasma reach downward until several mm to several cm from plasma supply opening, then plasma reaction region 107 is formed.

When silicon nitride is deposited, other silicon source gas or nitrogen source gas can be used. As silicon source gas, silane, disilane, or mixed gas made of these gases attenuated by inert gas can be used. As nitrogen source gas, ammonia, nitrogen, or mixed gas made of these gases attenuated by inert gas can be used.

Silicon nitride film can be deposited by independently supplying silicon source gas and nitrogen source gas through flow passage plates laying side-by-side among a plurality of flow passage plates. During this process, it is possible to flow curtain-enclosed gas made of inert gas such as nitrogen through flow passage plates surrounding the plates for source gases. The flow rate of silicon source gas and nitrogen source gas can be independently controlled, which enables precise control of process conditions.

Alternatively, silicon nitride film can be deposited by supplying a mixed gas made of silicon source gas and nitrogen source gas through identical flow passage plates. The configuration of an apparatus can be simplified.

As another example of deposited film, silicon film can be deposited by not supplying nitrogen source gas but supplying silicon source gas.

During the excitation of plasma for deposition process, it is preferable to cool down an electrode by introducing a mixed gas comprising or including noble gas (for example, Ar and $N_2$) nearby the electrode in the flow passage plate. When an electrode is not cooled down, and the temperature of the electrode itself rises by plasma excitation, a film which is not a dielectric member in use or extraneous material is attached on the surface of the electrode, and the function of the electrode is disabled. To prevent this problem, it is preferable to circulate cooling gas in a temperature of about 20 deg C.

Figure 11:
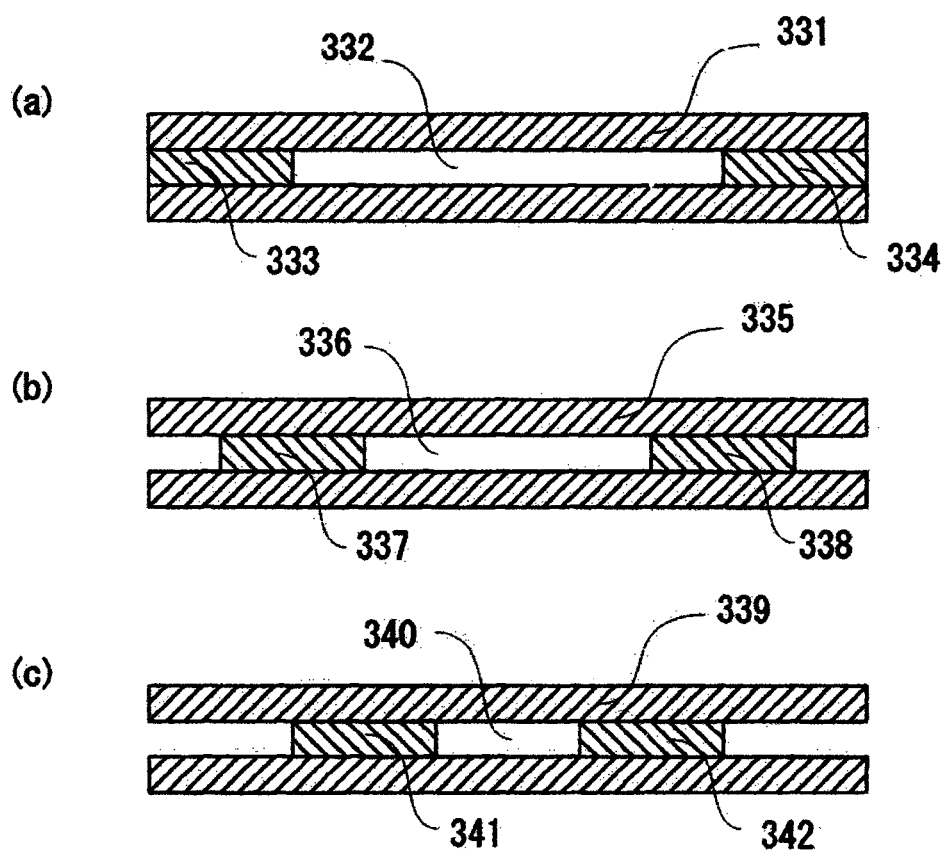
FIG. 11 is a cross-sectional diagram of a flow passage plate in a CVD apparatus according to the embodiment of the present invention.
Figure 12:
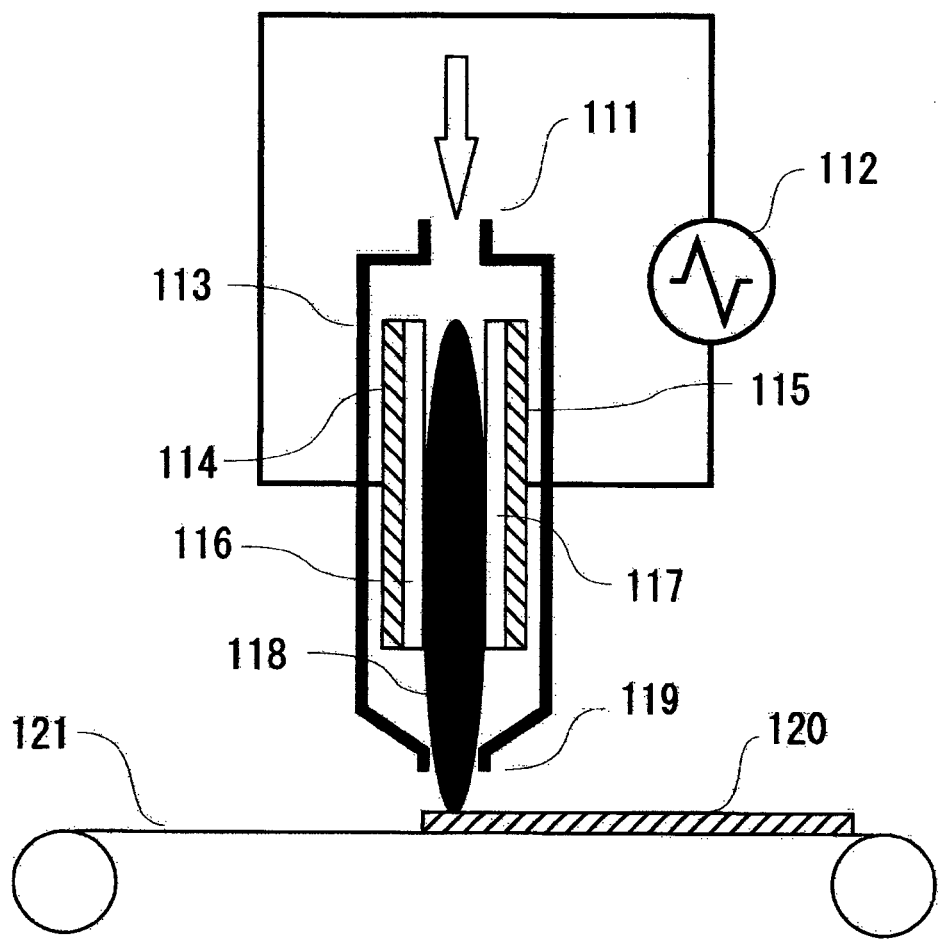
FIG. 12 is a cross-sectional diagram of a flow passage plate in a conventional CVD apparatus.

And also, a movable dielectric member is preferably fit in a space in gas passage or flow passage plate through which process gas or carrier gas flows. Quartz is preferably used as a dielectric member. By this arrangement, it is possible to control the cross-sectional area of flow passage so that the controllability of the process can be improved. FIGS. 11(a), (b), (c) are cross-sectional diagrams of a flow passage plate in a CVD apparatus according to the practical example of the present invention. The cross-sectional area of a flow passage 332 (FIG. 11(a)) surrounded by a flow passage plate 331 and dielectric members 333, 334 can be controlled by moving the dielectric members 333, 334 as shown in a flow passage 336 (FIG. 11(b)) and a flow passage 340 (FIG. 11(c)). The flow rate of process gas can be controlled by controlling the cross-sectional area of a flow passage. For example, the flow rate can be increased by narrowing the cross-sectional area of a flow passage.

(Plasma Generation Parameters)

Process conditions to generate plasma are appropriately determined according to the purpose to utilize plasma. When capacitance coupling plasma is generated, plasma is generated by applying constant electric field, high frequency electric field, pulsed electric field, micro-wave electric field between a pair of electrodes. When electric field is applied other than constant electric field, the used frequency can be 13.56 MHz which is used in a general plasma apparatus, or it can be higher than or lower than 13.56 MHz. In Patent Document 6, a technology to prevent plasma damage on the deposited film by using high frequency plasma of 100 MHz in a plasma apparatus is disclosed. By controlling the frequency of electric field, characteristics such as deposition rate, the quality of deposited film can be optimized.

Pulsed electric field is preferably used for plasma generation. Its field intensity is preferably in the range from 10 to 1000 kV/cm. Its frequency is preferably higher than or equal to 0.5 kHz.

(Inductive Coupling Plasma Apparatus)
(The Second Specific Example of a Unit Part of a Plasma Head)

Technical idea concerning plasma head according to the present invention is not limited to be applied for a plasma head for capacitance coupling plasma, but for example, it can be applied for a plasma head for inductive coupling plasma.

Figure 6:
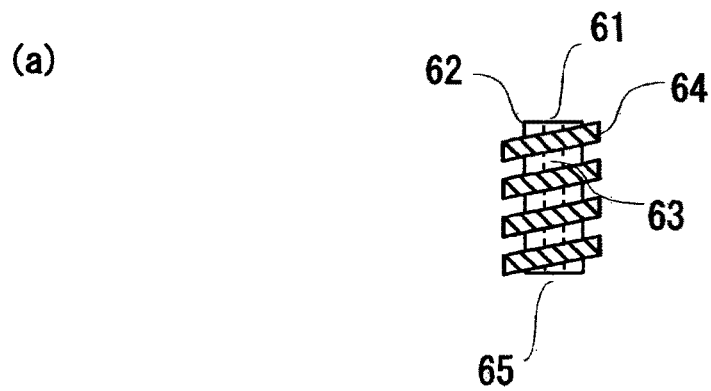
FIG. 6(a) is a front view diagram of a plasma head unit member according to the second specific example of the present invention.
FIGS. 6(b), (c) is a side view diagram of a plasma head according to the second specific example of the present invention.
Figure 6:
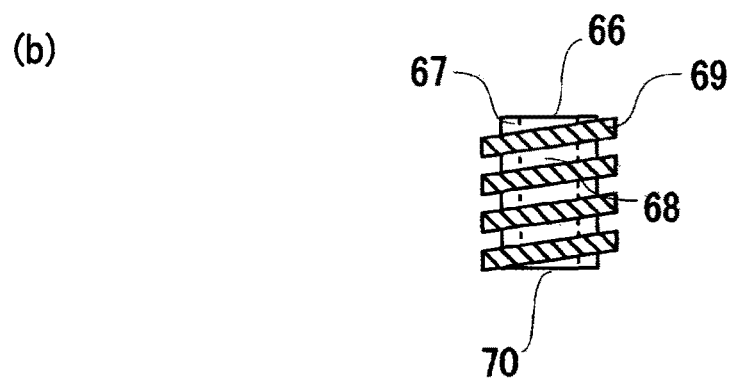
Figure 6:
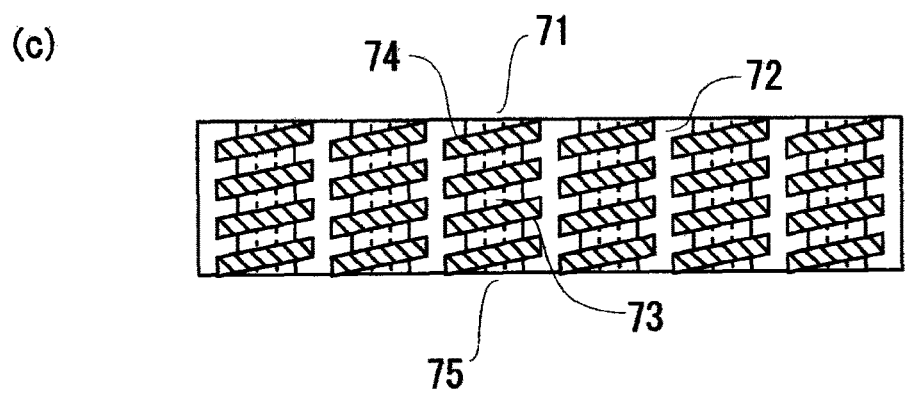

FIG. 6(a) is a front view diagram of a plasma head unit member according to the second specific example of the present invention. FIGS. 6(b), (c) is a side view diagram of a plasma head according to the second specific example. The unit part consists of a dielectric members 62 and an inductive coil 64 circumferentially placed adjacent to the member.

The dielectric members 62 is equipped with a hole which passes through from top down, and the hole functions as a plasma generation passage. The dielectric member 62 can be formed as an integral member, or it can be formed by pasting or fitting a plurality of members together. When the dielectric member is composed of a plurality of members, it is preferably processed so that no leakage occurs at a joint part. One end of the hole is used as a gas introduction opening 61. Then electrical current is applied to the inductive coil 64, and generated magnetic field provides magnetic energy to introduced gas molecules to generate plasma made of radicals, ions, and electrons. Plasma discharge state becomes stable glow discharge. Generated plasma blows out from plasma supply opening 65 which is the other end of the hole. The range where plasma is supplied depends on the condition of plasma generation, but generally speaking, plasma is supplied in the range of several mm-several cm from plasma supply opening 65. As shown in the side view diagram of FIG. 6(b), the unit part can be equipped with one plasma supply opening. And as shown in FIG. 6(c), it can be equipped with a plurality of plasma supply openings. When a deposition process is applied on a small substrate, plasma can be supplied from one plasma supply opening. When a deposition process is applied on a large substrate, plasma is preferably supplied from a plurality of plasma supply openings for better uniformity of deposition.

(The Third Specific Example of a Plasma Head)

Figure 7:
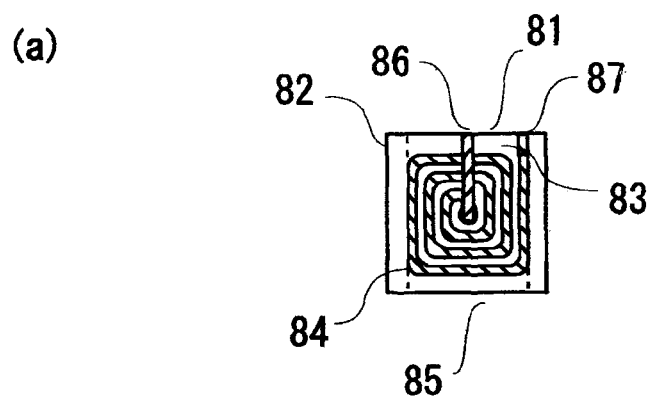
FIG. 7(a) is a front view diagram of a plasma head unit member according to the third specific example of the present invention.
FIGS. 7(b), (c) is a side view diagram of a plasma head according to the third specific example of the present invention.
Figure 7:
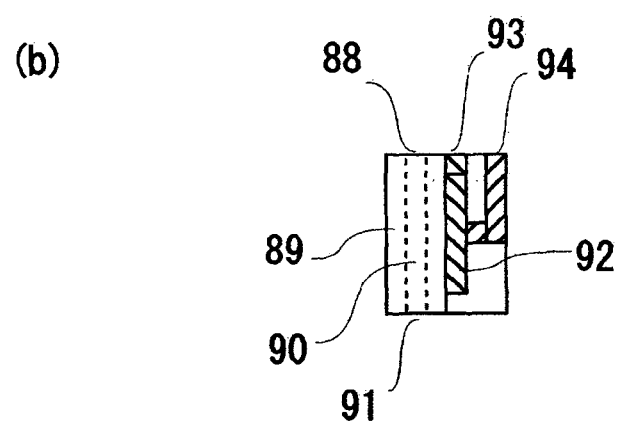
Figure 7:
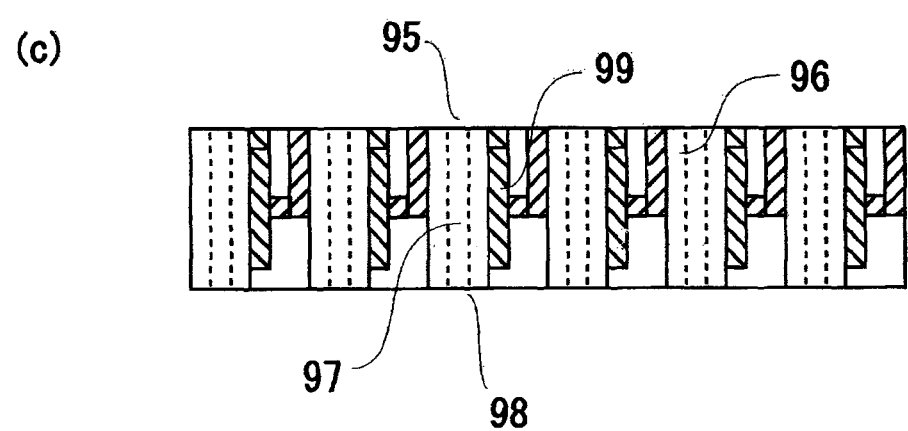

FIG. 7(a) is a front view diagram of a plasma head unit member according to the third specific example of the present invention. FIGS. 7(b), (c) is a side view diagram of a plasma head according to the third specific example. The unit part consists of a dielectric members 82 and an inductive coil 84 placed adjacent to the member. The dielectric members 82 is equipped with a hole which passes through from top down, and the hole functions as a plasma generation passage 83. The dielectric member can be formed as an integral member, or it can be formed by pasting or fitting a plurality of members together. When the dielectric member is composed of a plurality of members, it is preferably processed so that no leakage occurs at a joint part. The terminals 86, 87 of the inductive coil 84 are placed well away from each other so that they are not electrically shorted. One end of the hole is used as a gas introduction opening 81. Then electrical current is applied to the inductive coil 84, and generated magnetic field provides magnetic energy to introduced gas molecules to generate plasma made of radicals, ions, and electrons. Plasma discharge state becomes stable glow discharge. Generated plasma blows out from plasma supply opening 85 which is the other end of the hole. The range where plasma is supplied depends on the condition of plasma generation, but generally speaking, plasma is supplied in the range of several mm-several cm from plasma supply opening 85. As shown in the side view diagram of FIG. 7(b), the unit part can be equipped with one plasma supply opening. And as shown in FIG. 7(c), it can be equipped with a plurality of plasma supply openings. When a deposition process is applied on a small substrate, plasma can be supplied from one plasma supply opening. When a deposition process is applied on a large substrate, plasma is preferably supplied from a plurality of plasma supply openings for better uniformity of deposition.

(Method for Producing a Plasma Head)
(Bonding Method)

To fabricate dielectric members making up a plasma head according to the present invention, it is necessary to process a hollow portion with a complicated shape such as a plasma generation passage and a gas distribution passage. Such a dielectric member with a hollow portion can be fabricated by bonding dielectric members with a hollow portion or by bonding a dielectric member with a hollow portion and a flat dielectric member after forming a hollow portion on the surface of a plurality of dielectric members.

A plasma head unit part is formed by stacking an electrode or an inductive coil on the dielectric member with a hollow portion formed by this way. Furthermore, a plasma head is formed by stacking a plurality of plasma head unit parts via a shock absorbing member made of material such as Teflon™.

(Injection Molding Method)

A plasma head unit part can be fabricated by an injection molding method. A hydraulic core and an electrode or an inductive coil are placed in a mold, and material of a dielectric member is injected in the mold, then a fabricated part is unmolded and the hydraulic core is removed with the electrode or the inductive coil left behind. Furthermore, a plasma head is formed by stacking a plurality of plasma head unit parts via a shock absorbing member made of material such as Teflon™.

(Points of Difference with Similar Technologies)

In Patent Document 4, a process to reform the property or sterilize on the surface of an object by blowing out plasma to the object is disclosed, the plasma generated by dielectric discharge from a plasma head formed by bundling a plurality of dielectric thin tubes. A plurality of plasma supply openings is equipped in the technology disclosed in Patent Document 4, but gas inlets and electrodes to generate plasma of each thin tube do not function independently. And there is no description to suggest a technology where gas inlets and electrodes are independently equipped in each thin tube. Therefore it is not easy to invent a technology according to the present invention wherein a plurality of different plasmas is generated in a plurality of plasma generation units, and plasma reaction is carried out in a space between a plasma head and a substrate by referring to this document.

In Patent Document 5, a process to form an organic thin film including metal such as silicon oxide by a reaction of gas including metal such as TEOS and oxygen is disclosed. But the technology described in Patent Document 5 is a technology wherein a thin film is formed by mixing and reacting reaction gas which is in plasma state and metal-including gas which is not in plasma state. Therefore this technology is different from the technology of the present invention wherein a plasma head is composed of a plurality of unit parts installed in parallel, and different plasmas are generated in each unit part, and film deposition is carried out by the reaction between the different plasmas. The technology according to the present invention is a technology wherein a plurality of plasma supply openings to generate different plasmas can be very closely and densely placed by stacking alternately a plurality of dielectric members and electrodes. Therefore it is not easy to invent a technology according to the present invention by referring to this document.

INDUSTRIAL APPLICABILITY

As above mentioned, by using a CVD apparatus and a method for forming CVD film according to the present invention, low cost production of a high quality nitride film can be materialized for the purpose of, for example, forming antireflection film of a solar battery, which makes a huge contribution to the field of electronics.

PREFERRED EMBODIMENTS

Several embodiments of a method for forming CVD film according to the present invention are described in detail as follows, but the present invention is not limited to these embodiments.

Preferred Embodiment 1

(The First Test on Electrodes)

Minimum supply voltage necessary to spontaneously generate plasma was measured by setting different several conditions for the ambient of a hollow portion and gas which flows in the flow passage plate in order to investigate optimum conditions for plasma generation for an electrode (upper electrode) with a hollow portion according to the present invention. For comparison, the voltage was measured for an electrode without a hollow portion. And also, a flow passage plate was formed using ceramic members, and a gas flow passage was formed on the lateral side of the flow passage plate.

TABLE 1

Minimum RF power (W) necessary for spontaneously generating plasma

| Ambient in a hollow portion | Gas (carrier gas) which flows in a flow passage plate | | |
|---|---|---|---|
| | Ar 100% | Ar 85% N$_2$ 15% | Ar 70% N$_2$ 30% |
| Ar gas enclosed at 50 Torr | 500 (W) | 900 | 2000 |
| Ar gas enclosed at 250 Torr | 700 | 1100 | 1800 |
| Ar gas enclosed at 500 Torr | 800 | 1600 | 2000 |
| Ne gas enclosed at 50 Torr | 400 | 1000 | 2200 |
| Ne gas enclosed at 250 Torr | 600 | 1100 | 1700 |
| Ne gas enclosed at 500 Torr | 900 | 1500 | 2100 |
| Atmospheric pressure | 600 | 1500 | 1300 |
| Vacuum | 500 | 1500 | 2100 |
| Without a hollow portion | 600 | 1000 | 2100 |

In addition, members as follows were used for the components of a discharge electrode.
An electrode wire: a linear electrode wire made of Ni, one terminal was connected to a metal foil made of Mo, emitter material was not used
Ceramic member: quartz It was found that an optimum CVD condition was when RF power necessary for spontaneously generating plasma was less than or equal to 700 W because spark discharge was not generated and plasma state was stable. And it was found that Ar gas not including N$_2$ was preferable for carrier gas flowing in a flow passage plate to maintain stable plasma. And it was found that vacuum or Ar gas enclosed at less than or equal to 250 Torr was preferable as an ambient of a hollow portion. And according to the other experiment using other gases as enclosed gas, excellent result was obtained when noble gas such as Ne was used as carrier gas and enclosed gas in the hollow portion, the result being similar to the result when Ar was used.

Preferred Embodiment 2

(The Second Test on Electrodes)

Next, minimum RF power necessary for spontaneous plasma generation was measured using an electrode formed according to the present invention by changing the material of members and the condition of gas which flows in a flow passage plate. Discharge electrodes were equipped with hollow portions filled with noble gas at a pressure of 250 Torr. The flow passage plate was made of heat resisting metal and flow passages were formed along the side of the plate.

TABLE 2

Minimum RF power (W) necessary for spontaneously generating plasma

| Ambient in a hollow portion | Gas (carrier gas) which flows in a flow passage plate | | |
|---|---|---|---|
| | Ar 100% | Ar 85% N$_2$ 15% | Ar 70% N$_2$ 30% |
| Condition 1 | 700 (W) | 1000 | 1700 |
| Condition 2 | 800 | 1100 | 1800 |
| Condition 3 | 600 | 900 | 1600 |
| Condition 4 | 800 | 1000 | 1800 |
| Condition 5 | 1000 | 1300 | 2100 |
| Condition 6 | 700 | 1000 | 1700 |
| Condition 7 | 700 | 1100 | 1600 |
| Condition 8 | 600 | 1000 | 1600 |

Condition 1: a linear electrode wire made of Ni alloy, one terminal was connected to a metal foil made of Mo, emitter material was not used, ceramic member was made of quartz, Ni—W alloy was used as Ni alloy.

Condition 2: a linear electrode wire made of Ni, one terminal was connected to a metal foil made of Mo alloy, emitter material was not used, ceramic member was made of quartz, Mo—W alloy was used as Mo alloy.

Condition 3: a linear electrode wire made of W including 1 weight % of Th, one terminal was connected to a metal foil made of Mo, emitter material was not used, ceramic member was made of quartz.

Condition 4: a linear electrode wire made of W including 4 weight % of Th, one terminal was connected to a metal foil made of Mo, emitter material was not used, ceramic member was made of quartz.

Condition 5: a linear electrode wire made of W including 10 weight % of Th, one terminal was connected to a metal foil made of Mo, emitter material was not used, ceramic member was made of quartz.

Condition 6: a linear electrode wire made of W including 4 weight % of ThO, one terminal was connected to a metal foil made of Mo, emitter material was not used, ceramic member was made of quartz.

Condition 7: a linear electrode wire made of Ni, one terminal was connected to a metal foil made of Mo, emitter material was not used, ceramic member was made of translucent alumina.

Condition 8: a coiled electrode wire made of Ni, one terminal was connected to a metal foil made of Mo, emitter material was not used, ceramic member was made of quartz.

Preferred Embodiment 3

(The Third Test on Electrodes)

Next, minimum RF power necessary for spontaneous plasma generation was measured using an electrode formed according to the present invention by changing a layer made of emitter material formed on the surface of an electrode wire and the condition of gas which flows in a flow passage plate. Discharge electrodes were equipped with hollow portions filled with noble gas at a pressure of 250 Torr.

TABLE 3

| Minimum RF power (W) necessary for spontaneously generating plasma | | | |
|---|---|---|---|
| Atmosphere in a hollow portion | Gas (carrier gas) which flows in a flow passage plate | | |
| | Ar 100% | Ar 85% N₂ 15% | Ar 70% N₂ 30% |
| Condition 9 | 800 (W) | 1100 | 1800 |
| Condition 10 | 600 | 900 | 1500 |
| Condition 11 | 700 | 1000 | 1400 |
| Condition 12 | 700 | 900 | 1600 |
| Condition 13 | 600 | 900 | 1600 |
| Condition 14 | 700 | 1000 | 1500 |
| Condition 15 | 700 | 900 | 1400 |

Condition 9: a linear electrode wire made of Ni, one terminal was connected to a metal foil made of Mo, emitter material was not used, ceramic member was made of quartz, Ni—W alloy was used as Ni alloy.
Condition 10: a linear electrode wire made of Ni, one terminal was connected to a metal foil made of Mo, emitter material was made of TiSrO having perovskite type crystal structure formed by glue coating and firing, ceramic member was made of quartz.
Condition 11: a linear electrode wire made of Ni, one terminal was connected to a metal foil made of Mo, emitter material was made of MgO having perovskite type crystal structure formed by glue coating and firing, ceramic member was made of quartz.
Condition 12: a linear electrode wire made of Ni, one terminal was connected to a metal foil made of Mo, emitter material was made of TiO having perovskite type crystal structure formed by glue coating and firing, ceramic member was made of quartz.
Condition 13: a linear electrode wire made of Ni, one terminal was connected to a metal foil made of Mo, emitter material was made of TiSrO having perovskite type crystal structure formed by MOCVD, ceramic member was made of quartz.
Condition 14: a linear electrode wire made of Ni, one terminal was connected to a metal foil made of Mo, emitter material was made of MgO having perovskite type crystal structure formed by MOCVD, ceramic member was made of quartz.
Condition 15: a linear electrode wire made of Ni, one terminal was connected to a metal foil made of Mo, emitter material was made of TiO having perovskite type crystal structure formed by MOCVD, ceramic member was made of quartz.

Preferred Embodiment 4

(The First Evaluation of Nitride Film)

When atmospheric pressure plasma is generated by supplying power from RF or LF power source via electrodes prepared for dielectric-barrier discharge, it is possible to soften the collision energy of electrons or charged reactive molecules which collide the surface of a substrate so as to control substrate damage and enhance desired reaction by, for example, applying bias voltage to the lower electrode in addition to simply applying appropriate effective voltage between the upper electrode and the lower electrode. The film quality of silicon nitride film was evaluated which was deposited by applying bias voltage so that plasma was generated not only between an electrode and a substrate but also between an electrode and other electrode.

Figure 9:
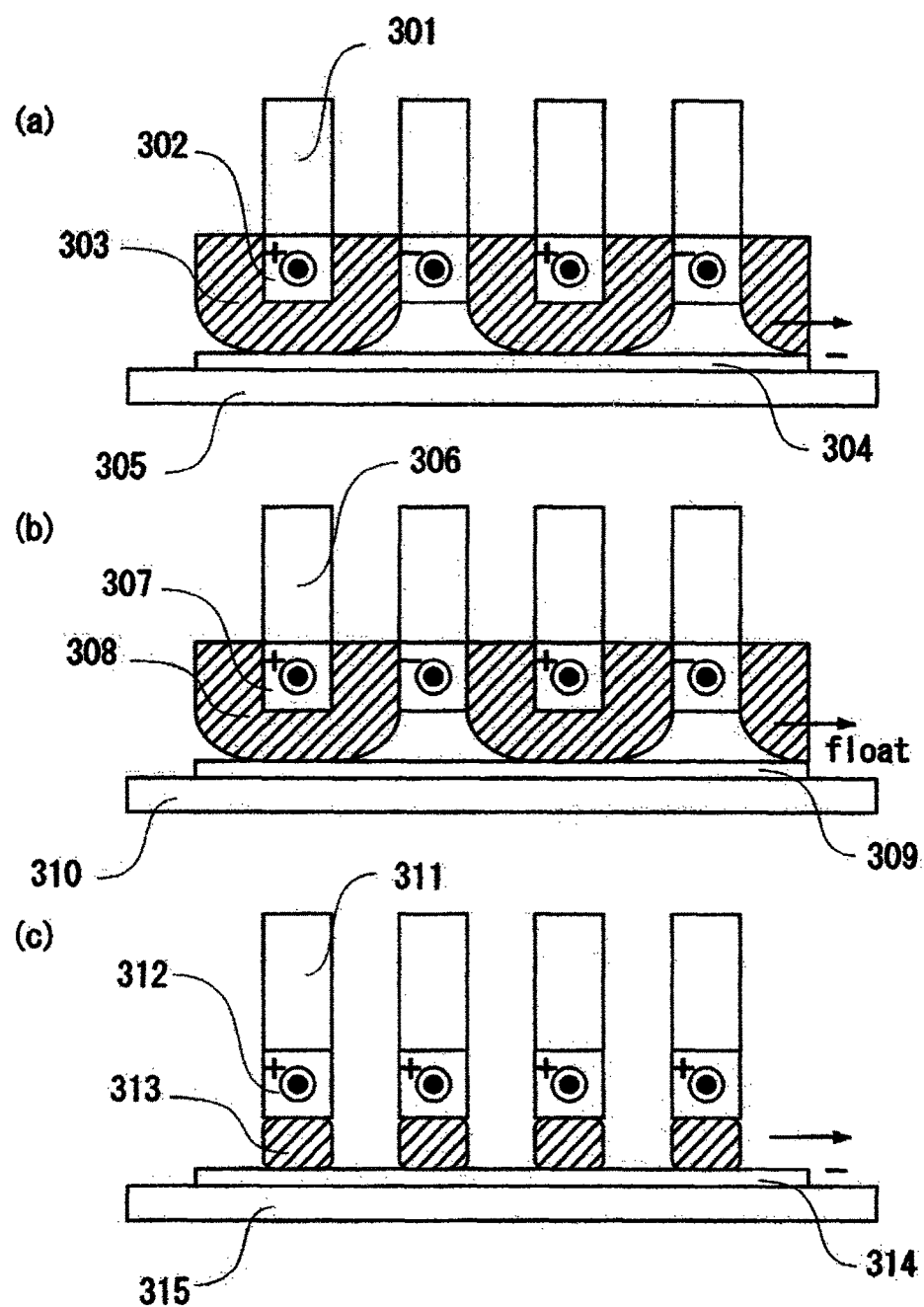
FIGS. 9(a), (b), (c) are cross-sectional diagrams of a plasma head in a CVD apparatus according to of the embodiment of the present invention.

FIGS. 9(a), (b), (c) are cross-sectional diagrams of a plasma head in a CVD apparatus according to of the embodiment of the present invention. FIG. 9(a) is a diagram which shows a plasma generation state when a substrate was connected to ground potential and positive bias voltages and negative bias voltages were alternatively applied to a plurality of electrodes. FIG. 9(b) is a diagram which shows a plasma generation state when a substrate was connected to floating potential in FIG. 9(a). FIG. 9(c) is a diagram which shows a plasma generation state when a substrate was connected to ground potential and positive bias voltages were applied to all electrodes.

Film quality was evaluated. In the case of FIG. 9(a), stable plasma was generated by glow discharge and a dense film was obtained. By contrast, in the case of FIGS. 9(b) and (c), stable plasma was generated by glow discharge but a less dense film was obtained in comparison to FIG. 9(a). In the case of FIG. 9(a), plasma is generated between neighboring electrodes, plasma region is wide, and deposition rate is large. And deposited film presumably receives less damage because collision of positive ions to a substrate is weakened.

TABLE 4

| The deposition rate of silicon nitride film and its film quality evaluation (relative value) | | | | |
|---|---|---|---|---|
| | Conventional thermal CVD film | Film depsited according to the present invention | | |
| | | FIG. 9(a) | FIG. 9(b) | FIG. 9(c) |
| Upper electrode (+) voltage | | 200 (V) | 200 | 200 |
| Upper electrode (−) voltage | | 0 | 0 | NA |
| Lower electrode (−) voltage | | 0 | float | 0 |
| Deposition rate | 10 | 20~40 | 15~35 | 10~30 |
| Etching rate | 10 | 10~30 | 40~60 | 40~60 |

Discharge electrode was made of the following members. Plasma excitation frequency was 13.56 MHz.
Electrode wires were placed in the hollow portion. The ambient of the hollow portion is vacuum state.
Electrode wire: a linear electrode wire made of Ni, one terminal was connected to a metal foil made of Mo, emitter material was not used, ceramic member was made of quartz.

The technology according to the present invention was compared with nitride film deposition by conventional thermal CVD. In all the case of bias voltage application as shown in FIGS. 9(a), (b), (c), the increase of deposition rate was observed in the deposition method according to the present invention in comparison to the conventional method. Among these cases, especially high deposition rate was observed in the method as shown in FIG. 9(a). In addition, etching rate using buffered hydrofluoric acid for evaluation of the film quality of deposited film. When etching rate is lower, film quality is shown as being denser. By thermal CVD, the deposition of denser film is possible though deposition rate is low. Among CVD methods according to the present invention using a plasma head as shown in FIGS. 9(a), (b), (c), especially the film quality was found to be the densest by the method as shown in FIG. 9(a).

Preferred Embodiment 5

(The Second Evaluation of Nitride Film

The experiment of deposition and evaluation similar to the embodiment 4 was done by changing plasma excitation frequency.

TABLE 5

Plasma excitation frequency: 10 MHz
The deposition rate of silicon nitride film and
its film quality evaluation (relative value)

| | Film deposited according to the present invention | | |
|---|---|---|---|
| | FIG. 9(a) | FIG. 9(b) | FIG. 9(c) |
| Upper electrode (+) voltage | 200 (V) | 200 | 200 |
| Upper electrode (−) voltage | 0 | 0 | NA |
| Lower electrode (−) voltage | 0 | float | 0 |
| Deposition rate | 15~45 | 20~30 | 10~25 |
| Etching rate | 15~35 | 45~55 | 35~65 |

Preferred Embodiment 6

Figure 10:
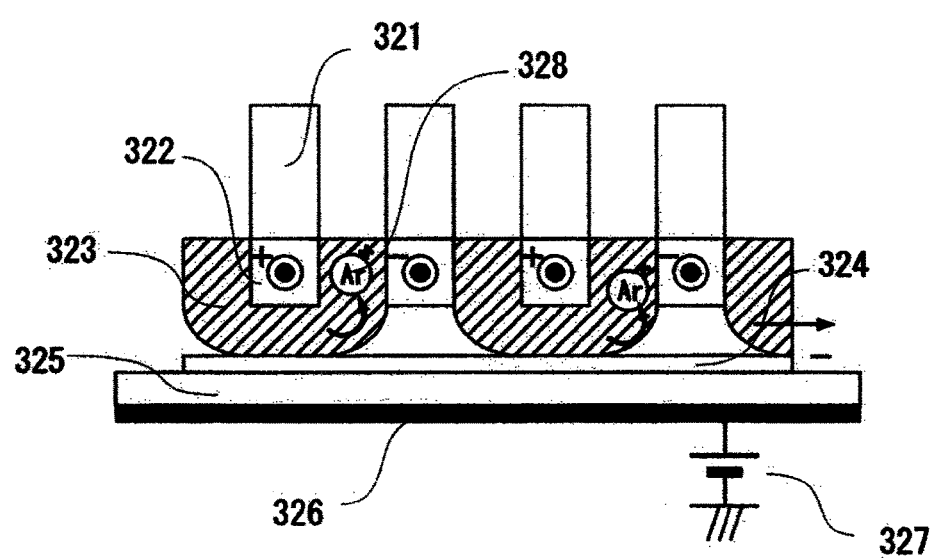
FIG. 10 is a cross-sectional diagram of a plasma head in a CVD apparatus according to the embodiment of the present invention.

In order to relax the damage of a substrate due to the collision of positive ions such as Ar ions, the effect of a method was evaluated, the method wherein a positive bias voltage was applied to the substrate. FIG. 10 is a cross-sectional diagram of a plasma head in a CVD apparatus according to the embodiment of the present invention. A dielectric substrate 325 was placed under the substrate 324, and an electrode for applying bias voltage 326 was placed under the dielectric substrate. Positive bias voltage was applied by a power source 327 to the electrode 326. And deposited film presumably receives less damage because collision of Ar positive ions 328 which moves from an electrode 322 to a substrate 324 is presumably weakened. The experiment showed that the quality of the deposited film was denser when positive bias voltage was applied by a power source 327 in comparison to the case when it was not applied.

TABLE 6

Plasma excitation frequency: 20 MHz
The deposition rate of silicon nitride film and
its film quality evaluation (relative value)

| | Film deposited according to the present invention | | |
|---|---|---|---|
| | FIG. 9(a) | FIG. 9(b) | FIG. 9(c) |
| Upper electrode (+) voltage | 200 V | 200 | 200 |
| Upper electrode (−) voltage | 0 | 0 | NA |
| Lower electrode (−) voltage | 0 | float | 0 |
| Deposition rate | 20~45 | 15~30 | 15~35 |
| Etching rate | 20~35 | 40~50 | 45~65 |

Preferred Embodiment 7

In order to investigate a cooling effect by a discharge electrode, an electrode temperature was measured after Ar gas plasma was generated for one hour under RF power of 2000 W applied at 13.56 MHz. The electrode temperature was 150° C. when cooling down was not done. On the other hand, when cooling down was done using Ar gas or nitrogen gas, the temperature was 50° C. and 60° C. respectively, which showed that adequate cooling effect was obtained.

The invention claimed is:

1. A plasma CVD apparatus, comprising:
   plural flow passage plates,
   the flow passage plates being stacked,
   each flow passage plate having a gas passage and a gas outlet side,
   each of the flow passage plates respectively also having a discharge electrode located at an end face of the gas outlet side,
   each discharge electrode composed of a ceramic member having a hollow portion; and
   an electrode wire located in each hollow portion and not making contact with the ceramic member,
   wherein a layer made of emitter material is formed on the surface of the electrode wire, and the emitter material has a smaller work function than the material of the electrode.

2. The plasma CVD apparatus according to claim 1, wherein the emitter material has a perovskite-type crystal structure.

3. The plasma CVD apparatus according to claim 1, wherein the emitter material is more than or equal to one chemical compound selected from the chemical compound group comprising TiSrO, MgO, TiO.

4. The plasma CVD apparatus according to claim 1, wherein the emitter layer is formed by a process wherein material of emitter layer is torn into pieces in a mortar, and resultant powder is solved in water, and the solution mixed with glue is coated on the surface of the electrode wire, and emitter layer is formed by sintering of coated wire.

5. The plasma CVD apparatus according to claim 1, wherein the emitter layer is formed by MOCVD.

6. A plasma CVD apparatus, comprising:
   plural stacked flow passage plates;
   plural discharge electrodes,
   each flow passage plate having a gas outlet side,
   each of the flow passage plates having a respective one of the plural discharge electrodes located at the gas outlet side,
   each discharge electrode composed of a ceramic member having a hollow portion; and
   an electrode wire located in each hollow portion and not making contact with the ceramic member,
   wherein a layer made of emitter material is formed on the surface of the electrode wire, and the emitter material has a smaller work function than the material of the electrode.

7. The plasma CVD apparatus according to claim 6, wherein the emitter material has a perovskite-type crystal structure.

8. The plasma CVD apparatus according to claim 6, wherein the emitter material is more than or equal to one chemical compound selected from the chemical compound group comprising TiSrO, MgO, TiO.

9. The plasma CVD apparatus according to claim 6, wherein the emitter layer is formed by a process wherein material of emitter layer is torn into pieces in a mortar, and resultant powder is solved in water, and the solution mixed with glue is coated on the surface of the electrode wire, and emitter layer is formed by sintering of coated wire.

10. The plasma CVD apparatus according to claim 6, wherein the emitter layer is formed by MOCVD.

* * * * *